(12) United States Patent
Lee et al.

(10) Patent No.: US 7,122,871 B2
(45) Date of Patent: Oct. 17, 2006

(54) INTEGRATED CIRCUIT FIELD EFFECT TRANSISTORS INCLUDING CHANNEL-CONTAINING FIN HAVING REGIONS OF HIGH AND LOW DOPING CONCENTRATIONS

(75) Inventors: Deok-Hyung Lee, Gyeonggi-do (KR); Byeong-Chan Lee, Gyeonggi-do (KR); Si-Young Choi, Gyeonggi-do (KR); Taek-Jung Kim, Gyeonggi-do (KR); Yong-Hoon Son, Gyeonggi-do (KR); In-Soo Jung, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/801,614

(22) Filed: Mar. 16, 2004

(65) Prior Publication Data
US 2004/0256683 A1    Dec. 23, 2004

(30) Foreign Application Priority Data
Jun. 20, 2003    (KR)    ............... 10-2003-0040279

(51) Int. Cl.
*H01L 29/78* (2006.01)
(52) U.S. Cl. .................. 257/412; 257/308; 257/328; 257/E21.438; 257/E21.442

(58) Field of Classification Search ................ 257/250, 257/270, 300, 308, 328, 329, 347–351, 353, 257/365, 368, 369, 412, E21.438, E21.442
See application file for complete search history.

(56) References Cited

U.S. PATENT DOCUMENTS

| 5,428,237 A | * | 6/1995 | Yuzurihara et al. | ......... 257/349 |
| 5,844,278 A | | 12/1998 | Mizuno et al. | |
| 6,525,403 B1 | * | 2/2003 | Inaba et al. | ................. 257/618 |
| 2004/0126969 A1 | * | 7/2004 | Brown et al. | ............... 438/257 |
| 2004/0217433 A1 | * | 11/2004 | Yeo et al. | .................... 257/412 |

* cited by examiner

*Primary Examiner*—Thomas L. Dickey
(74) *Attorney, Agent, or Firm*—Myers Bigel Sibley & Sajovec, P.A.

(57) ABSTRACT

Integrated circuit field effect transistors include an integrated circuit substrate and a fin that projects away from the integrated circuit substrate, extends along the integrated circuit substrate, and includes a top that is remote from the integrated circuit substrate. A channel region is provided in the fin that is doped a conductivity type and has a higher doping concentration of the conductivity type adjacent the top than remote from the top. A source region and a drain region are provided in the fin on opposite sides of the channel region, and an insulated gate electrode extends across the fin adjacent the channel region. Related fabrication methods also are described.

13 Claims, 8 Drawing Sheets

INTEGRATED CIRCUIT FIELD EFFECT TRANSISTORS INCLUDING CHANNEL-CONTAINING FIN HAVING REGIONS OF HIGH AND LOW DOPING CONCENTRATIONS

RELATED APPLICATIONS

This application claims the benefit of Korean Patent Application No. 2003-0040279, filed Jun. 20, 2003, the disclosure of which is hereby incorporated herein by reference in its entirety as if set forth fully herein.

FIELD OF THE INVENTION

This invention relates to integrated circuit devices and fabrication methods therefor, and more particularly to integrated circuit field effect transistors and fabrication methods therefor.

BACKGROUND OF THE INVENTION

Integrated circuit field effect transistors are widely used in integrated circuit devices, such as logic, memory and/or processor devices. For example, integrated circuit field effect transistors are widely used in Dynamic Random Access Memory (DRAM) devices. As is well known, a conventional integrated circuit field effect transistor includes spaced apart source and drain regions in an integrated circuit substrate, with an insulated gate electrode therebetween. In operation, a channel is formed in the substrate between the source and drain regions and beneath the insulated gate electrode.

As the integration density of integrated circuit field effect devices continues to increase, the channel length may decrease to submicron dimensions. These short channel devices may create various undesirable short channel effects, such as punch-through. Semiconductor-on-insulator devices have been developed to potentially reduce short channel effects. In contrast with a bulk field effect transistor that is formed in bulk semiconductor, in a semiconductor-on-insulator device the field effect transistor is formed in a semiconductor layer on an insulator layer on a base substrate.

In other attempts to reduce short channel and/or other effects, double-gated field effect transistors have been developed. In a double-gated field effect transistor, a bottom gate and a top gate may be formed on opposite sides of the channel region.

Field effect transistors having projecting regions also have been developed in attempts to reduce short channel and/or other effects. For example, U.S. Pat. No. 5,844,278 to Mizuno et al. describes a "Semiconductor Device Having a Projecting Element Region", as noted in the Mizuno et al. Title. As noted in the Mizuno et al. Abstract, a semiconductor device includes a substrate having a projection-shaped semiconductor element region, a gate electrode formed through a gate insulating film on the upper face and side face of the element region, and a first conductivity type source region and drain region provided in a manner to form a channel region on the upper face of the element region across the gate electrode, and which has a high concentration impurity region containing a second conductivity type impurity at a concentration higher than that on the surface of the channel region in the central part of the projection-shaped semiconductor element region.

SUMMARY OF THE INVENTION

Integrated circuit field effect transistors according to some embodiments of the present invention include an integrated circuit substrate and a fin that projects away from the integrated circuit substrate, extends along the integrated circuit substrate, and includes a top that is remote from the integrated circuit substrate. A channel region is provided in the fin that is doped a predetermined conductivity type and has a higher doping concentration of the predetermined conductivity type adjacent the top than remote from the top. A source region and a drain region are provided in the fin on respective opposite sides of the channel region, and an insulated gate electrode extends across the fin adjacent the channel region.

In some embodiments, the channel region is uniformly doped a predetermined conductivity type at a first doping concentration, except for being doped the predetermined conductivity type at a second doping concentration that is higher than the first doping concentration adjacent the top. In other embodiments, the channel region comprises a first region of the predetermined conductivity type adjacent the top, and a second region of the predetermined conductivity type remote from the top, wherein the first region is more heavily doped than the second region. In yet other embodiments, the fin also includes first and second sidewalls that extend between the top and the substrate, and the channel region has the higher doping concentration of the predetermined conductivity type directly beneath the top from the first sidewall to the second sidewall.

Embodiments of the present invention may be provided using bulk semiconductor and semiconductor-on-insulator substrates. In bulk semiconductor embodiments, a region of the predetermined conductivity also may be provided in the bulk semiconductor substrate beneath the fin. Integrated circuit field effect transistors according to embodiments of the invention also may be used in DRAM devices, wherein a capacitor is connected to the source region and/or a bit line is connected to the drain region.

Integrated circuit field effect transistors may be fabricated according to some embodiments of the present invention by forming a fin that projects away from an integrated circuit substrate, extends along the integrated circuit substrate and includes a top that is remote from the integrated circuit substrate. Ions of a predetermined conductivity type are implanted into the fin orthogonal to the substrate. Ions of the predetermined conductivity type are implanted into the fin oblique to the substrate. The oblique implantation may occur prior to or after the orthogonal implantation. Spaced apart source and drain regions are formed in the fin and an insulated gate is formed on the fin. In yet other embodiments, ions are again implanted into the fin orthogonal to the substrate.

In other embodiments, an integrated circuit transistor is fabricated by forming a fin that extends vertically from a substrate, implanting a first impurity in an upper portion of the fin, and implanting a second impurity in an entire exposed surface of the fin. A gate insulation layer is formed on the fin, and a gate electrode is formed that crosses over the fin on the gate insulation layer. Source/drain regions are formed in the fin located at both sides of the gate electrode. The implantations form a first layer comprised of the first and second impurities in the upper portion of the fin, a second layer comprising the second impurity in the fin under the first layer, wherein the second layer is lightly doped relative to the first layer.

DETAILED DESCRIPTION

Figure 1:
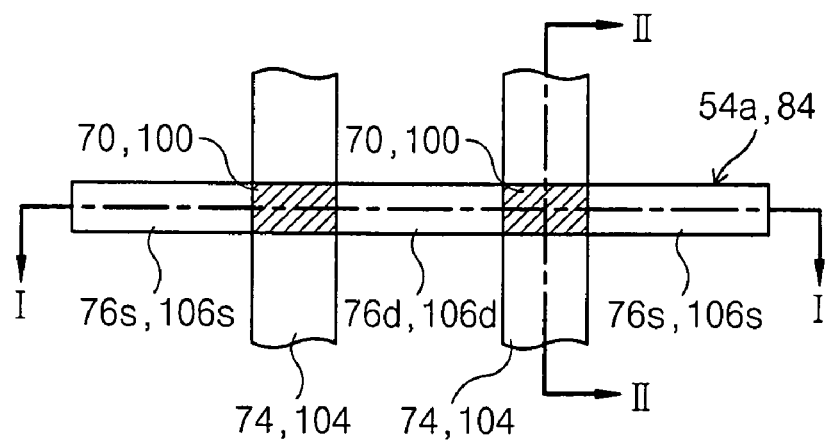
FIG. 1 is a top plan view of a pair of integrated circuit field effect transistors that may be used in a DRAM cell according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that if part of an element, such as a surface, is referred to as "outer," it is closer to the outside of the integrated circuit than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures.

Furthermore, relative terms, such as "lower" and "upper", may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" of other elements would then be oriented on "upper" of the other elements. The exemplary term "lower", can therefore, encompass both an orientation of lower and upper, depending of the particular orientation of the figure.

Finally, it will also be understood that although the terms first, second, etc. are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present-invention.

FIG. 1 is a top plan view of two field effect transistors according to embodiments of the present invention that may be used as part of the DRAM cell according to embodiments of the present invention. Moreover, other embodiments of the invention can comprise a single field effect transistor. FIG. 1 will be used as top plan view for FIGS. 2A and 2B, and for FIGS. 9A and 9B. Accordingly, two sets of reference numbers are used in FIG. 1. As shown in FIG. 1, field effect transistors according to some embodiments of the present invention include a fin 54a, 84 and a gate electrode 74, 104. The fin 54a, 84 extends vertically from a substrate. Stated differently, the fin 54a, 84 projects away from an integrated circuit substrate, extends along the integrated circuit substrate and includes a top that is remote from the integrated circuit substrate. Gate electrodes 74, 104 cross over the fin 54a, 84.

Still referring to FIG. 1, a common drain region 76d, 106d is formed between adjacent gate electrodes 74, 104. In other embodiments, separate drain regions may be used. A source region 76s, 106s is formed on opposite sides of the gate from the common drain region 76d, 106d. A channel region 70, 100 is formed in the fin beneath the gate electrode 74, 104.

When a pair of integrated circuit field effect transistors of FIG. 1 are used in a DRAM cell, a bit line may be connected to the common drain region 76d, 106d, and a capacitor may be connected to the source region 76s, 106s. These connections are not shown in FIG. 1. However, these connections are conventional.

FIGS. 2A–8 illustrate embodiments of the invention wherein an integrated circuit field effect transistor is fabricated in a bulk semiconductor layer, such as a conventional bulk silicon semiconductor substrate. FIGS. 9A–13 illustrate embodiments of the present invention wherein a field effect transistor is formed on a semiconductor-on-insulator substrate, wherein a semiconductor layer is provided on an insulating layer on a base substrate, which may itself be a semiconductor substrate. Bulk semiconductor substrates and semiconductor-on-insulator substrates are well known to those having skill in the art and need not be described further herein.

Figure 2A:
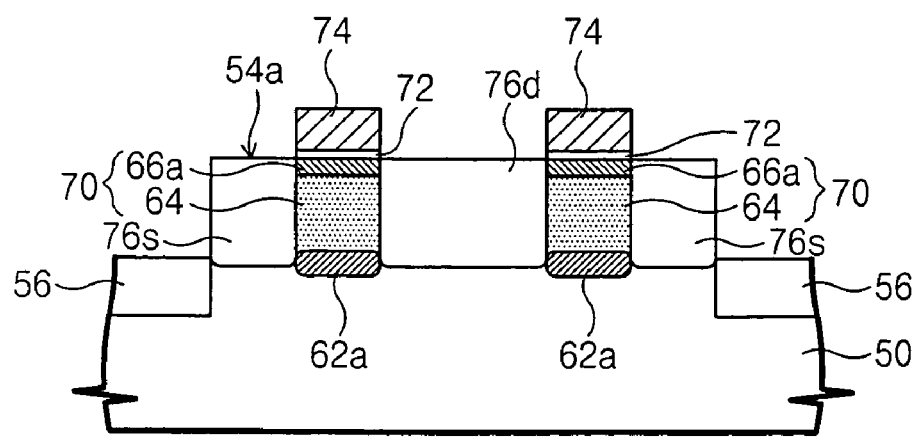
FIG. 2A is a cross-sectional view of a pair of integrated circuit field effect transistors according to embodiments of the present invention taken along the line I—I of FIG. 1.
Figure 2B:
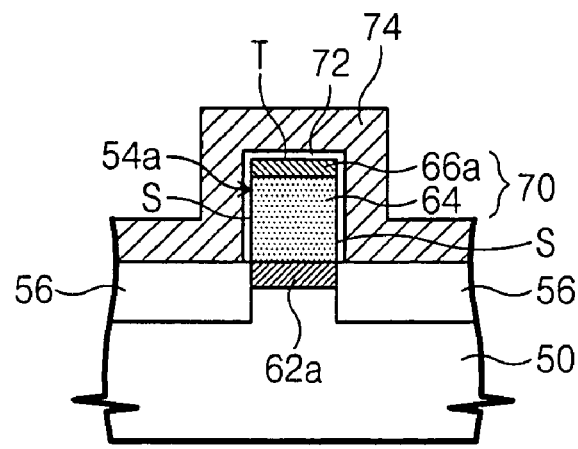
FIG. 2B is a cross-sectional view of an integrated circuit field effect transistor according to embodiments of the present invention taken along the line II—II of FIG. 1.

FIG. 2A is a cross-sectional view of integrated circuit field effect transistors taken along the line I—I of FIG. 1 according to some embodiments of the invention. FIG. 2B is a cross-sectional view of an integrated circuit field effect transistor according to some embodiments of the present invention, taken along the line II—II of FIG. 1.

Referring to FIGS. 2A and 2B, a device isolation layer 56 is formed using, for example, conventional trench isolation techniques, to define an active region on an integrated circuit substrate such as a silicon semiconductor substrate 50. The fin 54a extends vertically from the substrate 50 and is located on the active region. The pair of gate electrodes 74 crosses over the fin 54a. A gate insulation layer 72 is interposed between the gate electrode 74 and the fin 54a. The channel region 70 extends vertically from the substrate and is controlled by the gate electrode 74. In some embodiments, when the transistor is turned on, the channel region 70 is fully depleted.

Without wishing to be bound by any theory of operation, a transistor according to some embodiments of the present invention may be thought of as being comprised of three sub-transistors. The three sub-transistors can use both sidewalls S and an upper portion or top T of the fin 54a as a gate channel, respectively. In some embodiments, in order to improve the switching characteristics and to suppress leakage current in the off state, it may be desirable for the channel region 70 to have a uniform doping concentration. However, an electric field may be concentrated at the upper portion of the fin 54a. Thus, before the sub-transistors are turned on, a parasitic transistor, which is formed on the top T of the fin 54a, may be turned on. In order to reduce or prevent this problem, some embodiments of the present invention can provide a high threshold voltage of the parasitic transistor at the top T of the fin 54a by providing a high concentration impurity adjacent the top T of the fin 54a.

As shown in FIGS. 2A and 2B, in some embodiments, the channel region 70 includes a highly doped region 66a, and a relatively lightly doped region 64. The highly doped region 66a is formed at the top T of the fin 54a including the edge of the fin 54a, and the lightly doped region 64 is formed in the fin beneath the highly doped region 66a.

Source/drain regions may be formed by implanting impurities in the fin 54a at opposite sides of the channel region 70. A common drain region 76d is formed between the gate electrode 74, and a source region 76s is formed on opposite sides of the common drain region 76d. The gate electrodes 74 may be formed on the fin 54a and on the device isolation layer 56. Accordingly, in some embodiments, the gate electrode 74 may not control a portion of the fin located lower than the gate electrode 74 that is in contact with the device isolation layer 56. As a result, punch-through may occur at the fin. To reduce or prevent this punch-through, a transistor according to some embodiments of the present invention may further include a punch-through stop layer 62a. In some embodiments, the punch-through stop layer 62a is doped at a higher concentration than the lightly doped region 64.

Accordingly, FIGS. 1, 2A and 2B illustrate integrated circuit field effect transistors according to some embodiments of the present invention. These integrated circuit field effect transistors comprise an integrated circuit substrate 50 and a fin 54a that projects away from the integrated circuit substrate 50, extends along the integrated circuit substrate 50 and includes a top T that is remote from the integrated circuit substrate 50. A channel region 70 in the fin is doped a predetermined conductivity type and has a higher doping concentration (for example, at region 66a) of the predetermined conductivity type adjacent the top T than remote from the top (for example, in region 64). A source region 76s and a drain region 76d are provided in the fin 54a on respective opposite sides of the channel region 70. An insulated gate that comprises a gate electrode 74 and a gate insulating layer 72, extends across the fin 54a, adjacent the channel region 70.

As also illustrated in FIGS. 1, 2A and 2B, in some embodiments, the channel region 70 is uniformly doped a predetermined conductivity type at a first doping concentration, for example at region 64, except for being doped the predetermined conductivity type at a second doping concentration that is higher than the first doping concentration adjacent the top T, for example at region 66a. In other embodiments, the channel region 70 comprises a first region 66a of the predetermined conductivity type adjacent the top T and a second region 64 remote from the top T, wherein the first region 66a is more heavily doped than the second region 64. In still other embodiments, the fin also includes first and second sidewalls S that extend between the top T and the substrate 50, and the channel region 70 has higher doping concentration of the predetermined conductivity type directly beneath the top T from the first sidewall S to the second sidewall S, for example at region 66a.

FIGS. 3–8 are cross-sectional views of integrated circuit field effect transistors according to various embodiments of the present invention during intermediate fabrication steps according to various embodiments of the present invention. FIGS. 3–8 correspond to the cross-sectional views of FIG. 2B.

Figure 3:
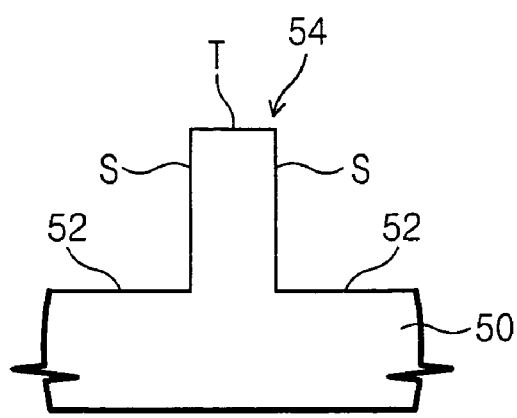
FIGS. 3–8 are cross-sectional views of integrated circuit field effect transistors according to various embodiments of the present invention during intermediate fabrication steps according to various embodiments of the present invention.

Referring to FIG. 3, the semiconductor substrate 50 is patterned to form the fin structure 54 having a top T and sidewalls S. As shown in FIG. 3, the fin structure 54 extends away from the integrated circuit substrate 50 and the device isolation layer 52. An oxide layer may be formed on the substrate 50 using a conventional thermal oxidation method. Then, the oxide layer may be removed to reduce the width of the fin region 54.

Figure 4:
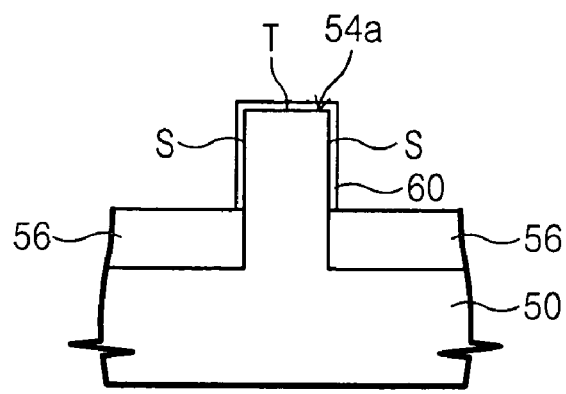

Referring now to FIG. 4, an insulation layer is formed on the substrate including on the fin region 54. The insulation layer then may be recessed to form the device isolation layer 56 at the device isolation region 52. A part of the fin 54a projects through the device isolation layer 56. A buffer oxide layer 60 may be further formed on the exposed portion of the fin 54a.

Figure 5:
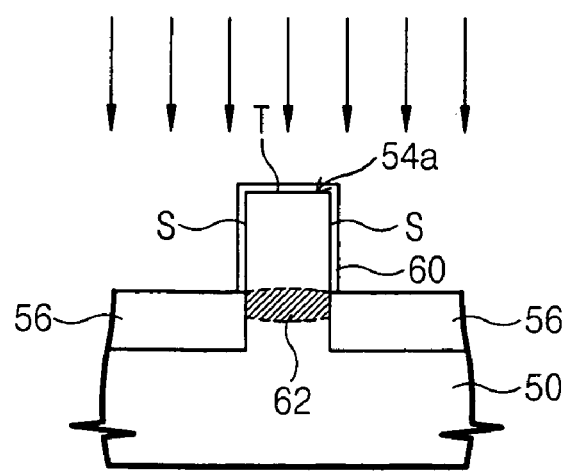

Referring to FIG. 5, ions are implanted into the substrate including the fin 54a to form a first region 62 in the substrate 50 beneath the exposed fin 54a. For example, in some embodiments, the first region 62 is formed at a concentration of about $10^{15}$ atoms/cm$^3$ to about $10^{19}$ atoms/cm$^3$ by implanting boron (B) or fluorine boron (BF$_2$) at a dose of about $10^{11}$ atoms/cm$^2$ to about $10^{14}$ atoms/cm$^2$. The implantation is generally orthogonal to the substrate 50, for example at an implantation angle of about 0° to about 10°.

Figure 6:
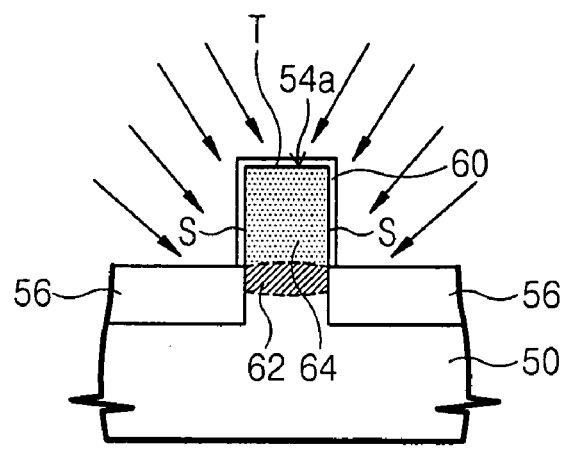

Referring to FIG. 6, ions are implanted into the surface of the exposed fin 54a to form a second region 64. In some embodiments, the second region 64 is formed conformally on the surface of the exposed fin 54a by implanting impurities using an oblique ion implantation method. In some embodiments, the second region 64 may be formed at a concentration of about $10^{15}$ atoms/cm$^3$ to about $10^{19}$ atoms/cm$^3$ by implanting boron (B) or fluorine boron (BF$_2$) at dose of about $10^{11}$ atoms/cm$^2$ to about $10^{14}$ atoms/cm$^2$. In some embodiments, the oblique implantation angle is between about 10° and about 45°. The second region 64 may extend under the exposed fin 54a to overlap with the first region 62.

Figure 7:
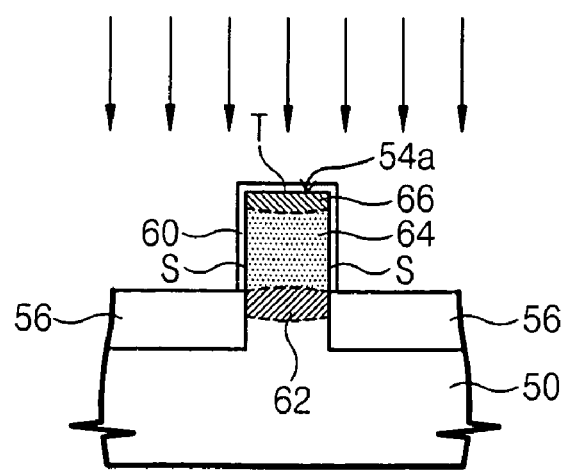

Referring to FIG. 7, ions are implanted into the top T of the exposed fin 54a to form a third region. In some embodiments, the third region 66 is formed at a concentration of about $10^{15}$ atoms/cm$^3$ to about $10^{19}$ atoms/cm$^3$ by implanting boron (B) or fluorine boron (BF$_2$) at dose of about $10^{11}$ atoms/cm$^2$ to about $10^{14}$ atoms/cm$^2$. In some embodiments, the orthogonal implantation angle is between about 0° and about 10°.

Accordingly, FIGS. 4–8 illustrate methods of fabricating an integrated circuit field effect transistor according to some embodiments of the present invention, by forming a fin that projects away from an integrated circuit substrate, extends along the integrated circuit substrate and includes a top that is remote from the integrated circuit substrate (FIG. 4). FIG. 6 illustrates implanting ions of a predetermined conductivity type into the fin oblique to the substrate, and FIG. 7 illustrates implanting ions of a predetermined conductivity type into the fin orthogonal to the substrate. FIG. 5 illustrates again implanting ions of the predetermined conductivity type into the fin orthogonal to the substrate. It will be understood that the operations of FIGS. 5–7 may occur out of the order shown in FIGS. 5–7, so that one or more of the sequences of implantations may be reversed from that shown.

Figure 8:
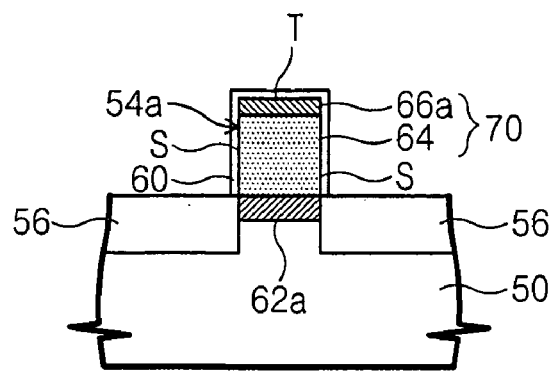

Referring now to FIG. 8, as a result of the implantations of FIGS. 5–7, a first region 62 overlaps with the second region 64 to form a punch-through stop layer 62a, which is some embodiments has a higher doping concentration than that of the second region 64. The third region 66 overlaps with the second region 64 to form a highly doped region 66a adjacent the top T of the fin 54. The second region 64 forms a uniformly doped layer in the fin 54a beneath the highly doped region 66a. The uniformly doped layer 64 is relatively lightly doped as compared with the heavily doped layer 66a. Thus, the channel region 70 of the transistor includes the heavily and lightly doped layers 66a and 64. In order to complete the transistor, the buffer oxide 60 may be removed, and the gate insulating layer 54 is formed on the surface of the fin 54a. The gate electrode 74 is formed on the gate insulating layer cross the fin 54. The source/drain region 76s and 76d may be formed in the fin on opposite sides of the gate electrode using the gate electrode as an implantation mask.

Figure 9A:
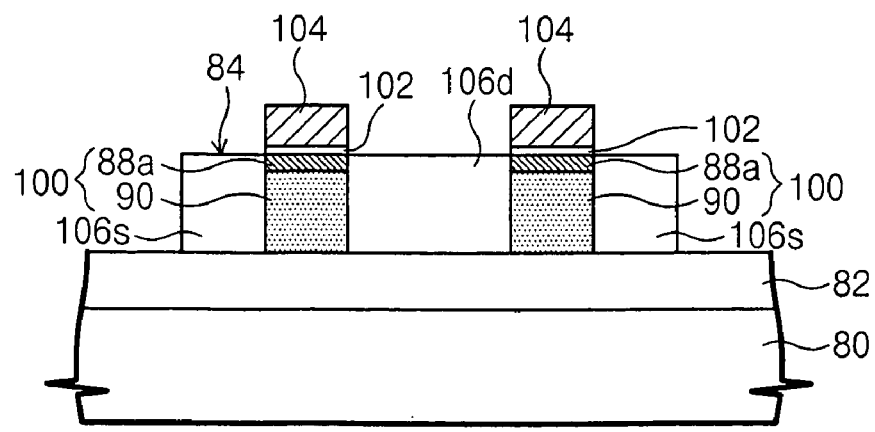
FIG. 9A is a cross-sectional view of a pair of integrated circuit field effect transistors according to embodiments of the present invention taken along the line I—I of FIG. 1.
Figure 9B:
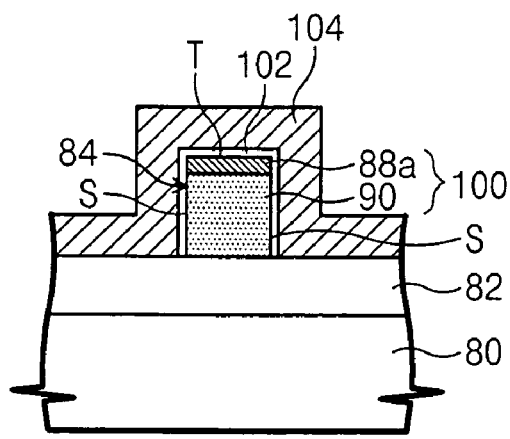
FIG. 9B is a cross-sectional view of an integrated circuit field effect transistor according to embodiments of the present invention taken along the line II—II of FIG. 1.

FIGS. 9A and 9B are cross-sectional views of integrated circuit field effect transistors according to other embodiments of the present invention, taken along lines I—I and II—II, respectively of FIG. 1. As was described above, these embodiments form integrated circuit field effect transistors on semiconductor-on-insulator substrates. More specifically, as shown in FIGS. 9A and 9B, the fin 84 is formed on an insulating layer 82, which is itself on a substrate 80, such as a support substrate. The substrate 80 may be a semiconductor substrate or may be a non-semiconductor substrate. The fabrication of semiconductor-on-insulator substrates are well known to those having skill in the art, and need not be described further herein.

A pair of gate electrodes 104 cross over the fin 84. A gate insulating layer 102 is interposed between the gate electrode 104 and the fin 84. The channel region 100 is formed in the fin 84 adjacent the gate electrode 104. In some embodiments, when the transistor is turned on, the channel region 100 is completely depleted. A heavily doped layer 88a is formed adjacent the top T of the fin. A lightly doped layer 90 is formed in the fin beneath the highly doped layer. Source/drain regions 106s, 106d are formed by implanting dopants in the fin 84 located at both sides of the channel region 70. A common drain region 106d or separate drain regions may be formed, and source regions 106s are formed, as was already described.

FIGS. 10–13 are cross-sectional views of integrated circuit field effect transistors according to embodiments of the invention that were described in connection with FIG. 9B during intermediate fabrication-steps according to various embodiments of the present invention.

Figure 10:
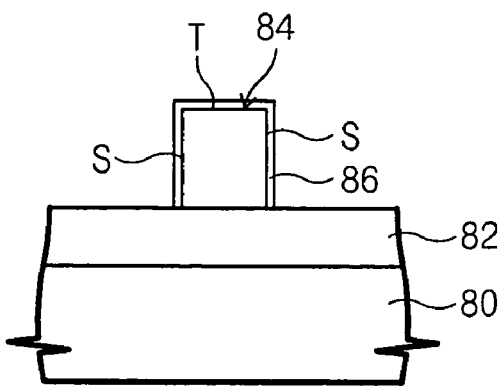
FIGS. 10–13 are cross-sectional views of integrated circuit field effect transistors according to various other embodiments of the present invention during intermediate fabrication steps according to various embodiments of the present invention.

Referring to FIG. 10, the semiconductor layer of the semiconductor-on-insulator substrate is patterned to form the fin 84. In some embodiments, the width of the fin 84 may be reduced by performing a thermal oxidation and removing the oxide layer. Accordingly, the fin 84 may have a width which need not be defined by photolithography. A buffer oxide layer 86 also may be formed on the fin 84.

Figure 11:
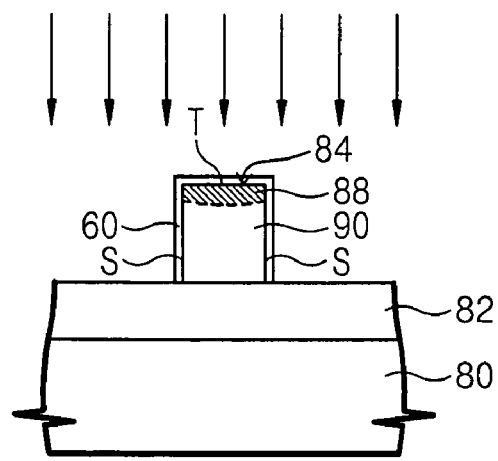

Referring to FIG. 11, dopants are implanted into the top T of the fin 84 to form a first region 88. In some embodiments, the first region 88 may be formed at a concentration of about $10^{15}$ atoms/cm$^3$ to about $10^{19}$ atoms/cm$^3$ by implanting boron (B) or fluorine boron (BF$_2$) at dose of about $10^{11}$ atoms/cm$^2$ to about $10^{14}$ atoms/cm$^2$. In some embodiments, the implantation angle is between about 0° to about 10°.

Figure 12:
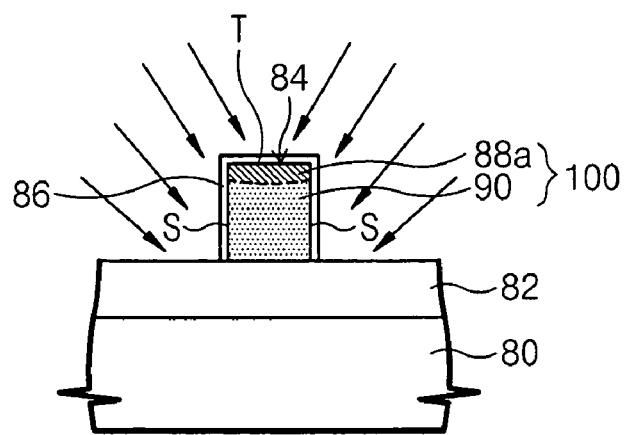

Referring to FIG. 12, a second region 90 is formed by implanting ions in the exposed surface of the fin 84. In some embodiments, the second impurity region 90 is formed uniformly on a whole surface of the fin 84 by an oblique ion implantation method.

In some embodiments, the second impurity region 90 may be formed at a concentration of about $10^{15}$ atoms/cm$^3$ to about $10^{19}$ atoms/cm$^3$ by implanting boron (B) or fluorine boron (BF$_2$) at dose of about $10^{11}$ atoms/cm$^2$ to about $10^{14}$ atoms/cm$^2$. In some embodiments, the oblique implantation angle may be between about 10° and about 45°.

It will be understood that the implantation sequences of FIGS. 11 and 12 may be reversed from that shown. Moreover, in contrast with embodiments of FIGS. 4–8, an implant of FIG. 5 is not performed in embodiments of FIGS. 10–13. In particular, in view of the semiconductor-on-insulator structure, there may be no need to form a layer in the substrate that prevents punch-through, because the fin 84 is formed on the insulating layer 82.

Figure 13:
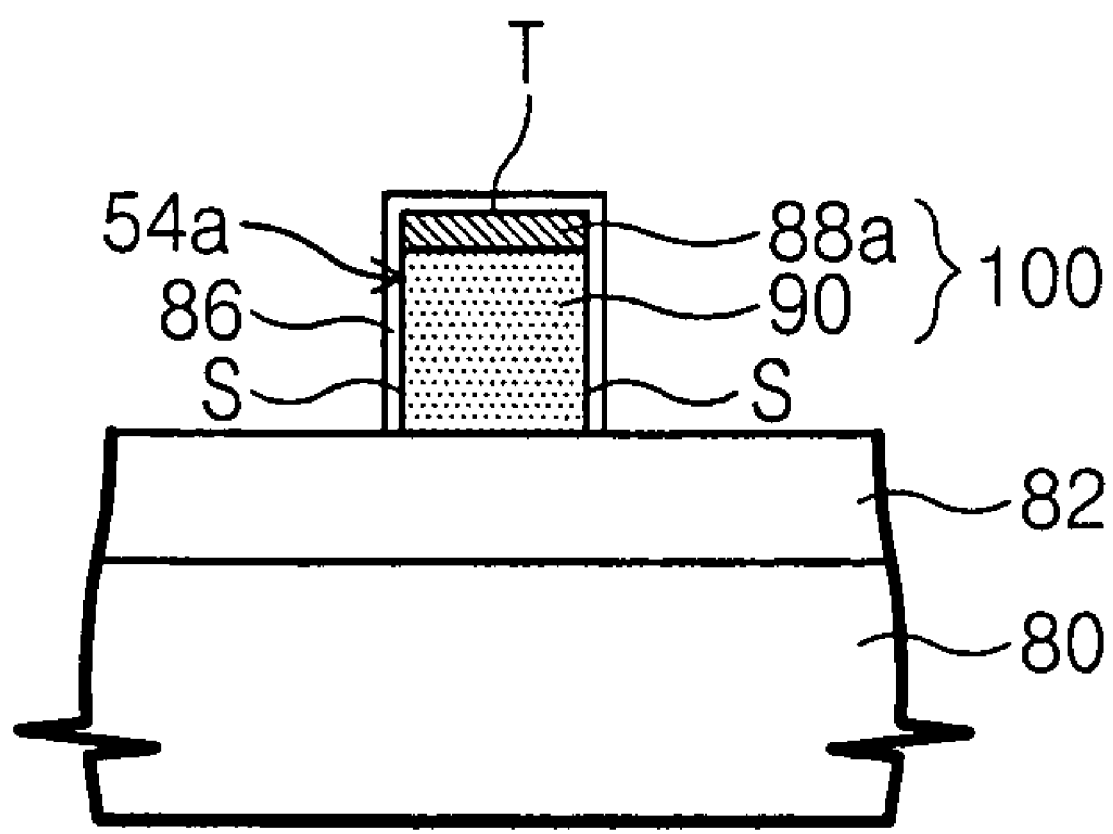

Accordingly, as shown in FIG. 13, the first region 88 overlaps with the second region 90 to form a highly doped layer 88a. The second region 90 forms the lightly doped layer having uniform doping concentration. The channel region 100 of the transistor includes the heavily and lightly doped layers 88a and 90. As was the case with FIG. 8, the buffer oxide layer may be removed. The gate insulation layer 102 may be formed. The gate electrode 104 is formed. Source/drain regions 106s and 106d is formed, to complete the transistor.

In some embodiments of the present invention, the threshold voltage of the transistor may be controlled, for example to one volt or higher by doping the channel region. As a result, current may be reduced during the off state. Moreover, the doping concentration at the top of the fin may be relatively high in some embodiments of the present invention, which can reduce or prevent formation of a channel before the main channel is turned on. In some embodiments, turn on of a parasitic transistor before the main channel may be reduced or prevented. It also may be possible to improve the switching characteristics by reducing sub-threshold swing values. Embodiments of the present invention may be used as a cell transistor of a DRAM device.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A field effect transistor comprising:
a fin extending from a substrate, the fin including an upper portion remote from the substrate and opposing sidewalls that extend between the upper portion and the substrate;
a channel region in the fin;
a gate electrode adjacent the channel region and crossing over the fin;
a gate insulation layer interposed between the gate electrode and the fin;
source/drain regions formed at both sides of the gate electrode, wherein the channel region at the upper portion of the fin is doped higher than sidewalls of the fin;
a device isolation layer on the substrate including respective portions that extend to a respective opposing sidewall of the fin to define an opening in the device isolation layer; and
a punch-through stop layer that is confined to within the opening between the portions of the device isolation layer, the punch-through stop layer having a higher doping concentration than the sidewalls of the fin in the channel region.

2. The transistor of claim 1, wherein the channel region comprises:
a first layer in the upper portion of the fin; and
a second layer beneath the first layer, wherein the second layer is lightly doped relative to the first layer.

3. The transistor of claim 2, wherein the punch-through stop layer has a higher doping concentration than the second layer.

4. The transistor of claim 2, wherein the second layer has uniform concentration in the channel region.

5. The transistor of claim 1:
wherein the substrate is a bulk semiconductor layer; and
wherein the semiconductor layer extends vertically to form the fin.

6. The transistor of claim 5, further comprising an insulation layer disposed between the gate electrode and the semiconductor layer at a periphery of the fin.

7. An integrated circuit field effect transistor comprising:
an integrated circuit substrate;
a fin that projects away from the integrated circuit substrate, extends along the integrated circuit substrate and includes a top that is remote from the integrated circuit substrate and opposing sidewalls that extend between the top and the integrated circuit substrate;
a channel region in the fin that is doped a predetermined conductivity type and having a higher doping concentration of the predetermined conductivity type adjacent the top than remote from the top;
a source region and a drain region in the fin on respective opposite sides of the channel region;
an insulated gate electrode that extends across the fin, adjacent the channel region;
a device isolation layer on the integrated circuit substrate including respective portions that extend to a respective opposing sidewall of the fin to define an opening in the device isolation layer; and
a punch-through stop layer that is confined to within the opening between the portions of the device isolation layer, the punch-through stop layer having a higher doping concentration of the predetermined conductivity type than the channel region remote from the top.

8. The integrated circuit field effect transistor according to claim 7 wherein the channel region is uniformly doped the predetermined conductivity type at a first doping concentration except for being doped the predetermined conductivity type at a second doping concentration that is higher than the first doping concentration adjacent the top.

9. The integrated circuit field effect transistor according to claim 7 wherein the channel region comprises a first region of the predetermined conductivity type adjacent the top and a second region of the predetermined conductivity type remote from the top, wherein the first region is more heavily doped than the second region.

10. The integrated circuit field effect transistor according to claim 7 wherein the channel region has the higher doping concentration of the predetermined conductivity type directly beneath the top, from one of the opposing sidewalls to the other of the opposing sidewalls.

11. The integrated circuit field effect transistor according to claim 7:
wherein the integrated circuit substrate is a bulk semiconductor substrate such that the bulk semiconductor substrate includes a projection that defines the fin;
the integrated circuit field effect transistor further comprising a region of the predetermined conductivity type in the bulk semiconductor substrate beneath the fin.

12. The integrated circuit field effect transistor according to claim 7 further comprising:
a capacitor connected to the source region.

13. The integrated circuit field effect transistor according to claim 7 further comprising:
a bit line connected to the drain region.

* * * * *